United States Patent [19]
Lee et al.

[11] Patent Number: 5,926,688
[45] Date of Patent: Jul. 20, 1999

[54] METHOD OF REMOVING THIN FILM LAYERS OF A SEMICONDUCTOR COMPONENT

[75] Inventors: Chien-Hsin Lee, Taichung Hsien; Yih-Yuh Doong, Kaohsiung, both of Taiwan

[73] Assignee: United Microelectronics Corporation, Taiwan

[21] Appl. No.: 08/933,930

[22] Filed: Sep. 19, 1997

[30] Foreign Application Priority Data

Jul. 25, 1997 [TW] Taiwan ................................. 86110630

[51] Int. Cl.⁶ ..................................................... H01L 21/00
[52] U.S. Cl. ..................................... 438/4; 438/12; 438/17
[58] Field of Search ................................ 438/4, 12, 712, 438/940, 961, 17; 148/DIG. 91, DIG. 92, DIG. 93

[56] References Cited

U.S. PATENT DOCUMENTS

| | | | |
|---|---|---|---|
| 4,729,970 | 3/1988 | Nath et al. ............................... | 438/12 |
| 5,326,709 | 7/1994 | Moon et al. ............................... | 438/12 |
| 5,705,411 | 1/1998 | Yamanobe et al. ...................... | 438/712 |
| 5,741,727 | 4/1998 | Wang ........................................ | 438/4 |

Primary Examiner—Kevin M. Picardat
Attorney, Agent, or Firm—Rabin & Champagne, P.C.

[57] ABSTRACT

A method of removing thin film layers of a semiconductor component suitable for exposing a defective thin film layer for failure analysis. A focused ion beam is used instead of conventional mechanical polishing in non-selectively etching the thin film layers above a defective thin film layer in a semiconductor component. The focused ion beam has a better control over the etching thickness, so that a higher sample point success rate is obtained from a test specimen. Processing time is saved using the focused ion beam, which requires only a few minutes compared with hours needed by the conventional mechanical polishing method. The focused ion beam performs localized etching only, so that the thin film layers of other sample points in the test specimen will be unaffected. Therefore, a number of sample points can be prepared on the same test specimen at the same time.

10 Claims, 2 Drawing Sheets

METHOD OF REMOVING THIN FILM LAYERS OF A SEMICONDUCTOR COMPONENT

BACKGROUND OF THE INVENTION

1. Field of Invention

The present invention relates to a method of removing thin film layers in a semiconductor component for failure analysis. More particularly, the present invention relates to a method of removing thin film layers in a semiconductor component using a focused ion beam (FIB).

2. Description of Related Art

A semiconductor component is composed of a number of thin film layers. Manufactured semiconductor components will normally go through a series of tests. Sometimes, a faulty semiconductor component is found through the testing, and a failure analysis needs to be carried out to find the root cause of the problem. To perform a failure analysis, all the thin film layers above the defective layer first have to be removed. For example, if there is a pin hole formation or a breakdown in the gate oxide layer of a MOS component, all the thin film layers above the gate oxide layer need to be removed to expose the defective gate oxide layer so that the component can be inspected. Therefore, how to remove the top thin film layers to reveal the defective thin film layer of a semiconductor component is a crucial step in failure analysis.

FIGS. 1A through 1C are a series of cross-sectional views showing the steps involved in removing all the thin film layers above a defective thin film layer of a semiconductor component according to a conventional method.

As shown in FIG. 1A, a silicon substrate 10 having at least a semiconductor component formed thereon is provided. The semiconductor component can be, for example, a MOS component 11 having a field oxide layer 12, a gate oxide layer 14, a gate terminal layer 15, source/drain terminals 16 and gate spacers 17. Furthermore, there are a multiple of interconnects, such as metallic layers 19 and 21, and insulating layers such as 18, 20 and 22, above the semiconductor component.

First, the semiconductor components above a wafer is electrically tested to check out the faulty component, for example, MOS component 11. Then, as shown in FIG. 1B, a mechanical polishing method is used to remove the metallic layers 19 and 21 and the insulating layers 18, 20 and 22 to expose the gate terminal layer 15. During polishing, the polishing end point are determined by visual inspection. As such, the process is difficult to control. Also, the polishing time is quite long, and requires roughly 2 hours.

Next, as shown in FIG. 1C, the gate terminal layer 15 is removed to expose the gate oxide layer 14 using potassium hydroxide (KOH) as the etching solution. Subsequently, a failure analysis is performed.

The above conventional method of removing the thin film layers has the following disadvantages, namely:

1. The time required to prepare the sample is quite long, because for every faulty component located, a test specimen has to be prepared. Subsequently, each sampled point requires roughly 2 hours of mechanical polishing time to remove all the thin film layers above the defective thin film layer.

2. Using a mechanical polishing method to control the residual thickness of a gate polysilicon layer is a complicated matter. Therefore, it is easy to get a failed sample. As such, the sampling success rate is small.

3. During specimen polishing, it is very difficult to keep the polishing machine absolutely horizontal and stable. As a result, when a sample point is ground to a suitable thickness, other parts of the test specimen may have been ground down to the silicon substrate, thus causing damage to other sampled points. Hence, only one sample point can be inspected for each test specimen using the mechanical polishing method.

In light of the foregoing, there is a need in the art for improving the method for removing the thin film layers above a defective thin film layer in a semiconductor component for failure analysis.

SUMMARY OF THE INVENTION

Accordingly, the present invention is directed to providing a method of removing thin film layers of a semiconductor component using a focused ion beam instead of mechanical polishing, that can reduce the test specimen preparation time, control the polysilicon gate thickness, and increase the sampling point success rate.

In another aspect, the invention provides a method of removing thin film layers of a semiconductor component for failure analysis such that a number of sample points can be simultaneously inspected on the same test specimen.

To achieve these and other advantages and in accordance with the purpose of the invention, as embodied and broadly described herein, the invention includes a method for removing thin film layers of a semiconductor component for subsequent failure analysis comprising providing a silicon substrate having at least a first thin film layer formed thereon. The first thin film layer has at least a second thin film layer thereabove. Etch removing is performed to the second thin film layer using a focused ion beam to expose the first thin film layer for failure analysis.

It is to be understood that both the foregoing general description and the following detailed description are exemplary, and are intended to provide further explanations of the invention as claimed.

BRIEF DESCRIPTION OF THE DRAWINGS

The accompanying drawings are included to provide a further understanding of the invention and are incorporated in and constitute a part of this specification. The drawings illustrate an embodiment of the invention and, together with the description, serve to explain the principles of the invention. In the drawings.

DESCRIPTION OF THE PREFERRED EMBODIMENT

Figure 1A:
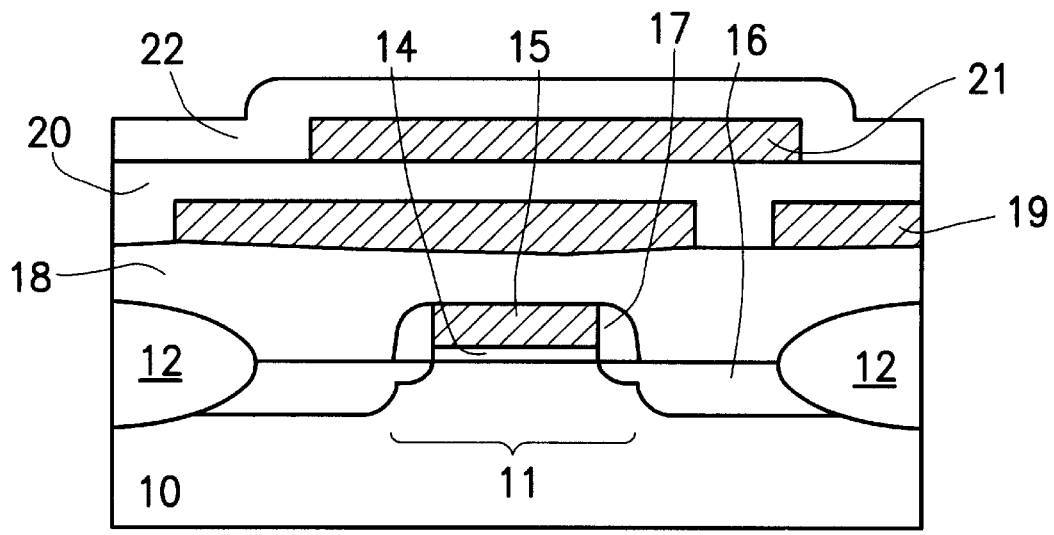
FIGS. 1A through 1C are a series of cross-sectional views showing the steps involved in removing all the thin film layers above a defective thin film layer of a semiconductor component according to a conventional method.
Figure 1B:
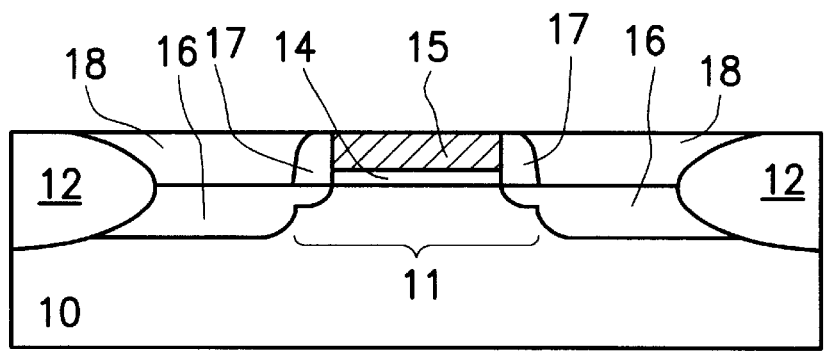
Figure 1C:
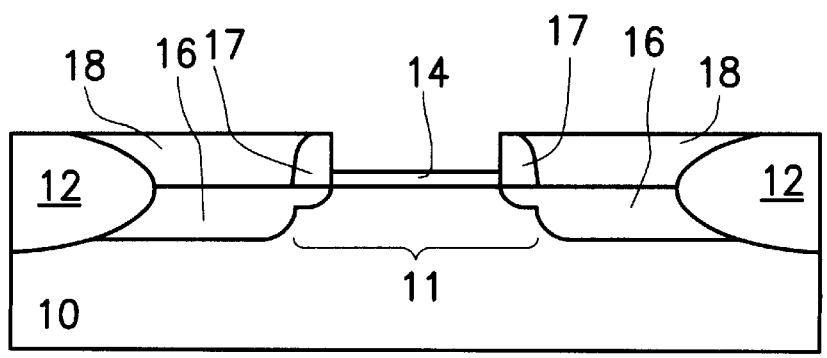

Reference will now be made in detail to the present preferred embodiment of the invention, an example of which is illustrated in the accompanying drawings. Wherever possible, the same reference numbers are used in the drawings and the description to refer to the same or like parts.

In accordance with the invention, there is provided a method for removing all the thin film layers above a defective thin film layer using a focused ion beam instead of mechanical polishing to facilitate the failure analysis of a semiconductor component.

Figure 2A:
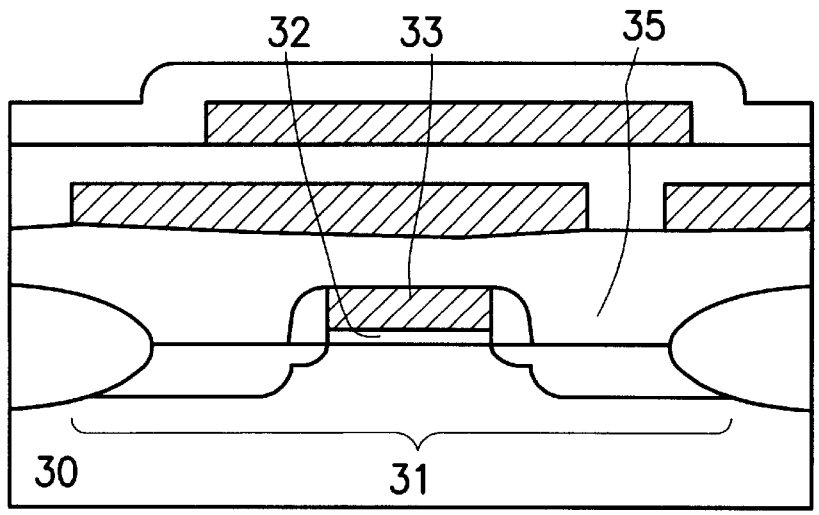
FIGS. 2A through 2C are a series of cross-sectional views showing the steps involved in removing all the thin film layers above a defective thin film layer of a semiconductor component according to a preferred embodiment of this invention.

First, as shown in FIG. 2A, a silicon substrate 30 having at least one semiconductor component 31 formed thereon is provided. The semiconductor component 31 includes a few thin film layers. For example, the semiconductor component may be a MOS component having at least a field oxide layer, a gate oxide layer, a gate terminal layer and a multiple of interconnect metallic layers and insulating layers.

Figure 2B:
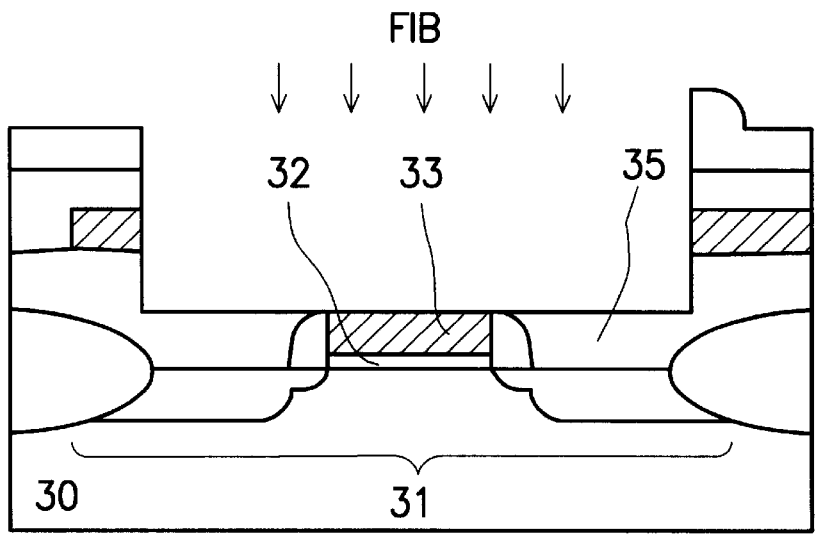

Next, in FIG. 2B, the semiconductor component above the wafer is electrically tested and a first thin film layer 32 in the semiconductor component 31 is found to be defective. For example, a breakdown may have occurred in the gate oxide layer of the MOS component. Then, a focused ion beam is used to bombard a second thin film layer 35 above the first thin film layer 32 to remove the second thin film layer 35. For example, the insulating layer and/or metallic layer above the gate oxide layer may be removed by the process. If there are other thin film layers above the second thin film layer, they will also be removed.

Figure 2C:
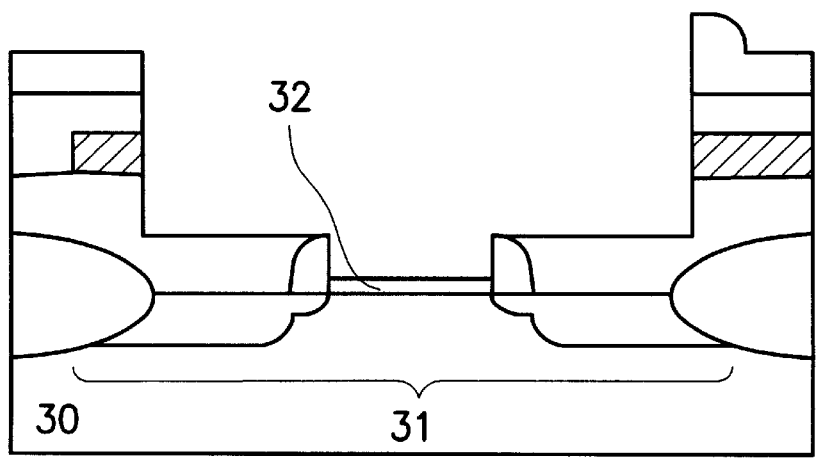

Because a focused ion beam has non-selective etching property, to keep the beam from etching into the defective first thin film layer 32, a barrier stop layer 33 between the first thin film layer 32 and the second thin film layer 35 is retained to function as the etching stop point for the focused ion beam. For example, a gate terminal layer having a thickness of about 400 Å is retained as a barrier stop layer above the gate oxide layer. Subsequently, as shown in FIG. 2C, a selective etching method is used, for example, a wet etching method, to remove the barrier stop layer 33, thus exposing the defective first thin film layer 32. For example, the gate terminal layer may be etched using a potassium hydroxide solution to expose the defective gate oxide layer. This completes the removal of the thin film layers in the semiconductor component, which is now ready for performing subsequent failure analysis.

Since the focused ion beam has a localized etching characteristic, when the thin film layers above the defective thin film layer are bombarded by the beam, the thin film layers in other semiconductor components in the same test specimen will be unaffected. Therefore, a number of sample points can be prepared on the same test specimen. Furthermore, by controlling the strength of the focused ion beam, the depth of etch can be precisely controlled, and the time required for the whole operation is just a few minutes. Hence, this invention has the following advantages, namely:

1. The removal time of the thin film layers is shorter, and thickness of the etched thin film layer can be precisely controlled.

2. A number of sample points can be investigated on the same test specimen, making failure analysis more convenient.

It will be apparent to those skilled in the art that various modifications and variations can be made to the present invention without departing from the scope or spirit of the invention. In view of the foregoing, it is intended that the present invention cover modifications and variations, provided they fall within the scope of the following claims and their equivalents.

What is claimed is:

1. A method of removing thin film layers of a semiconductor component, comprising:

providing a silicon substrate having at least a first thin film layer formed thereon, a barrier layer over the first thin film layer, and a second thin film layer above the first thin film layer and above the barrier layer, so that the barrier layer is located between the first thin film layer and the second thin film layer;

etch removing the second thin film layer using a focused ion beam, the barrier layer serving as an etching stop layer during said etch removing of the second thin film layer using the focused ion beam; and removing the barrier layer using selective wet etching to expose the first thin film layer for failure analysis.

2. The method of claim 1, further comprising performing electrical testing to determine a location of the first thin film layer for failure analysis.

3. A method of removing a thin film of a semiconductor component, comprising:

providing a silicon substrate having at least a gate oxide layer, a gate terminal layer formed on the gate oxide layer, and at least a thin film layer formed above the gate terminal layer;

removing the thin film layer using a focused ion beam to expose the gate terminal layer; and removing the gate terminal layer to expose the gate oxide layer for failure analysis.

4. The method of claim 3, further comprising performing electrical testing to determine a location of the gate oxide layer for failure analysis.

5. The method of claim 3, wherein the exposed gate terminal layer has a thickness of about 400 Å.

6. The method of claim 3, wherein said removing the gate terminal layer includes etching the gate terminal layer using a potassium hydroxide solution.

7. A method of analyzing a test specimen, comprising:

providing a test specimen to be sampled, the test specimen containing at least two semiconductor components, each having a first layer, and a second layer over the first layer;

exposing the respective first layers of the at least two semiconductor components by performing non-selective focused ion beam etching on the test specimen to etch through the respective second layers of the at least two semiconductor components; and performing a failure analysis on an exposed respective first layer of at least one of the at least two semiconductor components.

8. The method defined in claim 7, wherein said exposing includes etching through a respective barrier stop layer disposed between the respective first layers and the respective second layers using a selective etching procedure.

9. The method defined in claim 8, wherein said performing non-selective focused ion beam etching etches through the respective second layers without etching through the respective barrier stop layers, and wherein said etching through a respective barrier stop layer is performed after said performing non-selective focused ion beam etching.

10. The method defined in claim 9, further comprising performing electrical testing on the at least two semiconductor components to locate respective defective first layers of the at least two semiconductor components; and wherein said performing a failure analysis includes performing the failure analysis on the exposed respective defective first layers of the at least two semiconductor components.

* * * * *